(12) United States Patent
Just

(10) Patent No.: US 7,508,675 B2
(45) Date of Patent: Mar. 24, 2009

(54) COMPUTER SPACING AND STABILIZATION SYSTEM

(75) Inventor: Paul Just, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 274 days.

(21) Appl. No.: 11/622,880

(22) Filed: Jan. 12, 2007

(65) Prior Publication Data

US 2008/0170373 A1 Jul. 17, 2008

(51) Int. Cl.
*H05K 5/00* (2006.01)
*B65D 85/00* (2006.01)
*A47F 7/00* (2006.01)

(52) U.S. Cl. .................. 361/725; 361/683; 206/320; 206/576; 211/26; 211/13.1; 211/59.4; 211/49.1

(58) Field of Classification Search ......... 361/724–727; 312/223.2, 198, 273, 298, 301; 211/13.1, 211/59.4, 49.1
See application file for complete search history.

(56) References Cited

U.S. PATENT DOCUMENTS

| 6,179,121 | B1 * | 1/2001 | Ferguson et al. | ............ 206/311 |
| 2005/0265004 | A1 * | 12/2005 | Coglitore et al. | ............ 361/724 |

* cited by examiner

*Primary Examiner*—Jayprakash N Gandhi
*Assistant Examiner*—Nidhi Desai
(74) *Attorney, Agent, or Firm*—Merchant & Gould

(57) ABSTRACT

A system for spacing and stabilizing a row of computers includes a strap attached to a plurality of spacer blocks. The strap is arrayed over top of the computer row, and each spacer block is inserted between a pair of adjacent computers to provide substantially uniform spacing between the computers. An anchor block attached to each end of the strap is wrapped around an end computer at each end of the row, and each anchor block engages the corresponding end computer to limit movement of the strap. The assembly of the strap, the spacer blocks and the anchor blocks with the row of computers stabilizes the row of computers and inhibits a lateral toppling motion of the individual computers.

20 Claims, 8 Drawing Sheets

COMPUTER SPACING AND STABILIZATION SYSTEM

BACKGROUND

Computer data centers or high-density computer labs often utilize large numbers of relatively small computers in place of larger mainframe computers. These computers centers typically utilize racks or shelves to hold a number of identical personal computers, such as desktop, tower or Small Form Factor ("SFF") computers. Each computer within the lab may have a dedicated purpose (such as a Web server), or the computers may be networked together to provide enhanced processing and data storage capabilities.

Modern computers include numerous heat-generating components (such as high-speed processors and hard-disk storage devices), and each computer typically utilizes one or more internal fans to circulate cooling air within the computer case. Problems often arise when large numbers of computers are placed together, such as in the above-described computer centers or high-density computer labs. In particular, exotic cooling systems are frequently needed to maintain an adequate supply of cooling air for each of the computers within the lab. These cooling systems often utilize storage racks to securely mount and precisely space the individual computers in relation to blowers and/or air-conditioning systems that direct cooling air to each of the computers. However, the cost of such cooling system, including the racks used to secure and space each of the computers, is often disproportionate to the relatively low cost of the actual personal computers themselves.

SUMMARY

A system for spacing and stabilizing a row of computers includes a number of spacer blocks that are inserted between each pair of adjacent computers within the row. Each computer is thus separated from each adjacent computer by the spacer block that extends between the computers. In this manner, the spacer blocks provide uniform spacing between the computers to enhance the flow of cooling air in and around the computers. Each spacer block is secured to a strap that extends above a top surface of the row of computers. In one embodiment, the spacer blocks are fixed to the strap so that spacing between adjacent blocks is equal to a width dimension of the computers. Alternatively, the position of each spacer block on the strap may be adjustable to accommodate computers of different sizes. The spacer blocks may be formed from any material that is sufficiently rigid to maintain a desired spacing between the computers. Additionally, the spacer blocks may be shorter in length than the adjacent computers, or the blocks may include internal passageways or perforations to enhance the flow of cooling air between and around the computers.

An end portion of each strap wraps around an end computer at each end of the row so that an anchor block attached to each end of the strap can be positioned between the end computer and an adjacent computer. The position of the anchor block between the two end computers in the row anchors the end of the strap and stabilizes the entire row of computers. That is, the anchor blocks at each end of the strap inhibit a lateral toppling motion of the individual computers, thereby reducing the possibility that the row of computers might fall over domino-style.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

As briefly described above, embodiments of the present invention are directed to a system for spacing and stabilizing a number of computers arranged within a computer center or high-density computer lab. In particular, in those situations where large computer racks are not cost-effective or otherwise feasible for a given space, operators of a high-density computer lab may simply align a large number of personal computers next to each other on a shelf or table. These computers are preferably aligned in a vertical orientation in order to maximize the number of computers that will fit on a given shelf space (e.g., by turning desktop computers on their side or by using SFF computers designed for a vertical installation). Indeed, there is a tendency to stack the computers immediately adjacent to each other in order to achieve the highest possible density of computers on a particular shelf. However, compressing computers together in this manner inhibits the flow of cooling air in and around the individual computers, and may lead to premature failure of the heat-sensitive computer components.

Additionally, most personal computers are not inherently stable when they are aligned in a vertical orientation (i.e., a width dimension of the computer base is smaller than either a height or depth dimension), and such computers typically rely on dedicated stands to prevent the computer from inadvertently falling over. However, the use of individual stands requires an excessive amount of shelf space between adjacent computers, thereby reducing the number of computers that may fit on one shelf in a high-density environment. On the other hand, when a number of personal computers are arrayed side-by-side in a vertical orientation without the benefit of a rack or individual stabilizing stands, there is a danger that the entire row of computers may topple over like dominos, particularly if an individual accidentally collides with a computer at one end of the row.

Figure 1:
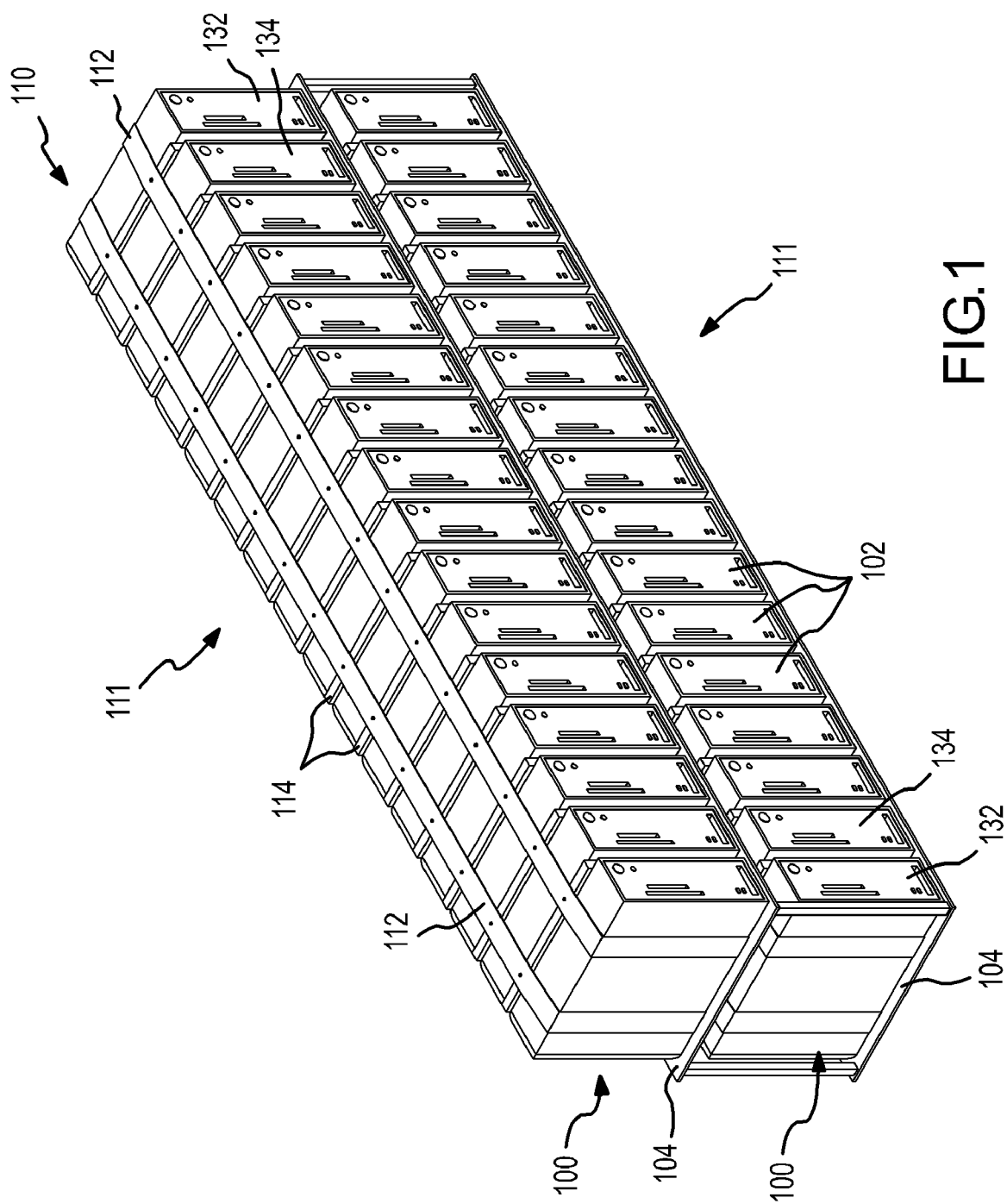
FIG. 1 illustrates two rows of vertically-oriented computers aligned on separate shelves, where each row of computers includes a spacing and stabilization system in accordance with one embodiment of the present invention.

FIG. 1 illustrates an exemplary embodiment of two rows 100 of computers 102 arrayed in a vertical orientation (i.e., wherein a relatively narrow base supports a relatively tall case). In the example shown, each row contains sixteen separate SFF computers 102, although the number or type of computers contained in one row 100 may vary and the present invention is not limited by the exemplary configuration shown in the drawing. Additionally, in the example shown in FIG. 1, the computers 102 are aligned on separate shelves or platforms 104 so that a base 106 (FIG. 4) of each computer 102 is supported on the platform 104. In particular, no fasteners or rack systems are utilized to support the computers 102 on the platform 104 shown in FIG. 1. Further, because power supply or other cooling fans within the computer cases often exhaust warm air to the rear of the computers 102, it is beneficial to provide paths to direct the warm air from behind the computer rows 100 (i.e., to help cool the computers 102).

Figure 2:
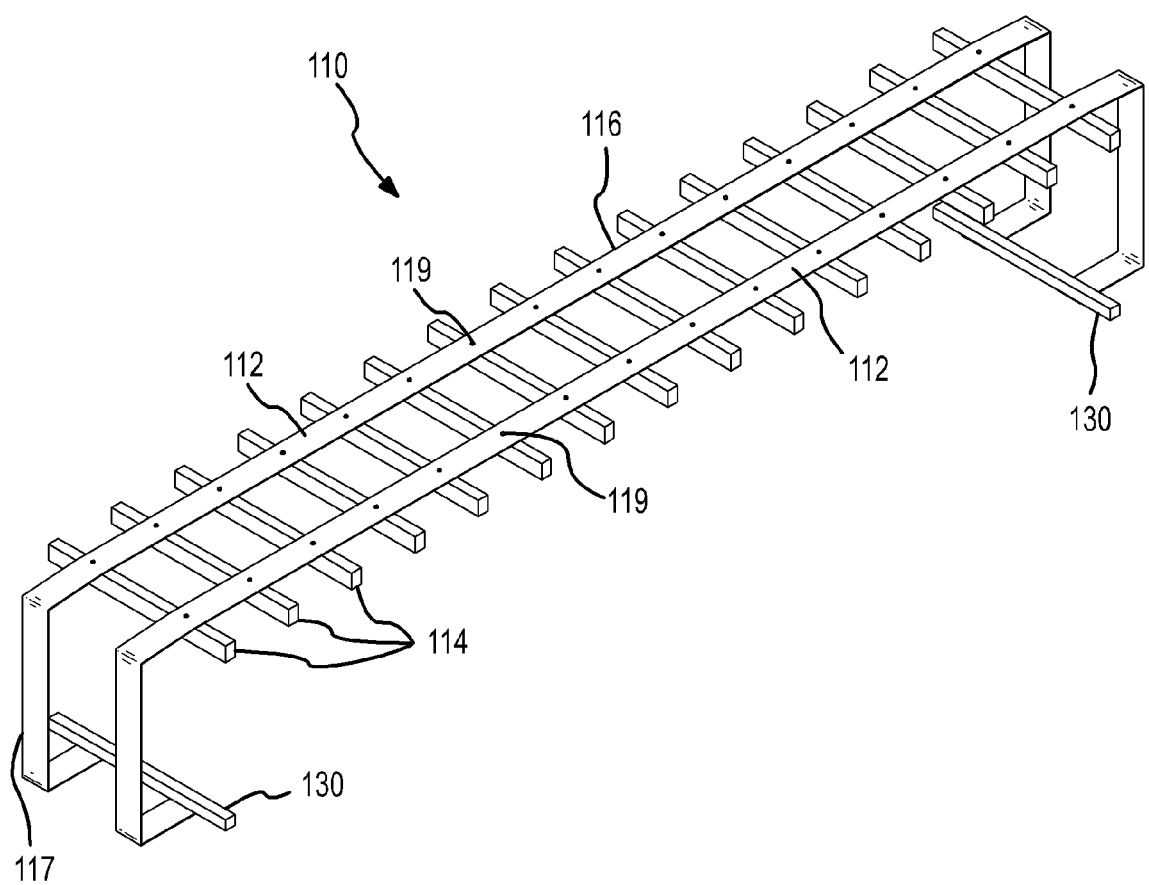
FIG. 2 illustrates a perspective view of the embodiment of the spacing and stabilization system shown in FIG. 1, wherein two straps are attached to a plurality of intermediate spacer blocks for spacing adjacent computers, and wherein opposing anchor blocks are attached to the ends of the straps to secure the straps at each end of the computer rows shown in FIG. 1.

FIGS. 1 and 2 illustrate one embodiment of a computer spacing and stabilization system 110 used to provide uniform spacing between adjacent computers 102 while also surrounding or wrapping the entire row 100 to form an assembly 111 and prevent the individual computers within the 100 from toppling over. The computer spacing and stabilization system 110 preferably includes at least one strap 112 connecting a series of spacer blocks 114. In one embodiment, the spacer blocks 114 are attached to a central portion 116 of the strap between opposing end portions 117, as best shown in FIG. 2. Additionally, in the exemplary embodiment shown in FIG. 1, two straps 112 are included, although as described below a single strap 112 may be used in place of the dual-strap configuration.

Figure 3:
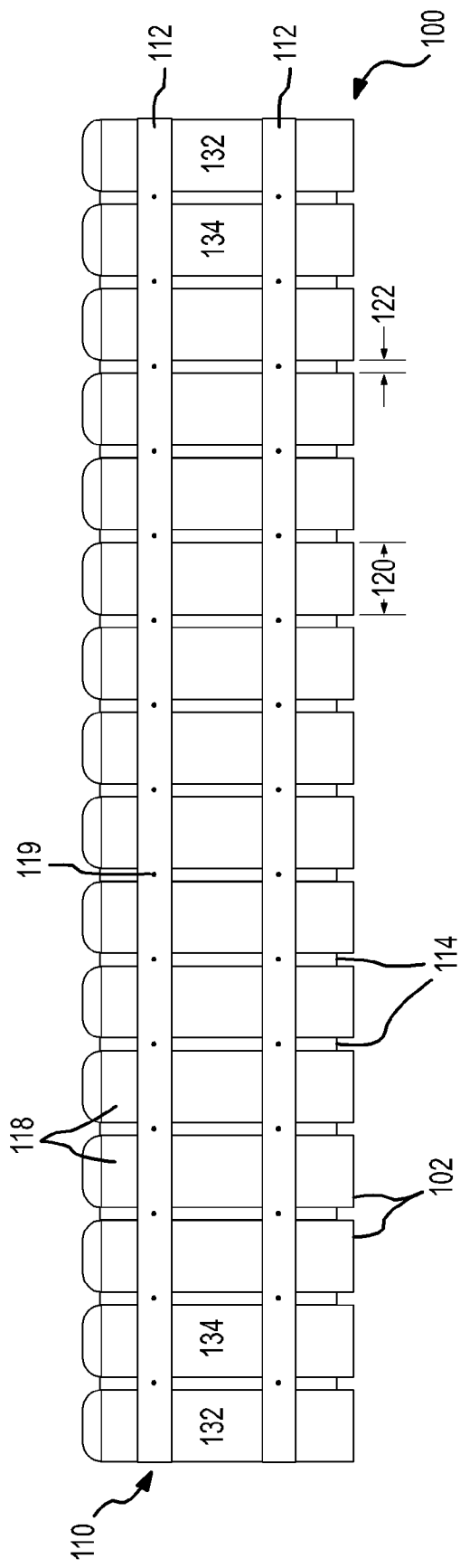
FIG. 3 illustrates a top view of one of the computer rows shown in FIG. 1, and further illustrates the uniform spacing between adjacent computers provided by the spacer blocks.

FIG. 3 illustrates a top view of one of the computer rows 100, wherein the straps 112 run along a top surface 118 of each computer 102 and support a plurality of the spacer blocks 114, wherein one block 114 is positioned between each pair of adjacent computers 102. FIGS. 2 and 3 illustrate that each spacer block 114 is connected to the straps 112 by conventional fasteners 119 (such as staples, nails or screws), although persons skilled in the art may utilize alternative means for securing the blocks 114 to the straps 112, including (but not limited to) adhesives or attachment buckles/brackets.

In the exemplary embodiment shown in FIGS. 1-6, the spacer blocks 114 are formed from wood (although alternative materials such as metal, plastic or foam may be used for the blocks 114, as described in greater detail below), and the straps 112 are formed from nylon or a similar material. Additionally, the straps 112 are attached to the blocks 114 in one embodiment with staples, although other fasteners or adhesives may be used as described above. Furthermore, the spacer blocks 114 are spaced apart according to a width dimension 120 (FIG. 3) of the computers 102. In the example shown in FIG. 1, the rows 100 are formed from identical computers 102 so that the width dimension 120 is uniform for each computer (e.g., approximately 3.5 inches for a typical SFF computer). However, the present invention is not limited to such uniform dimensions, and the spacer blocks 114 may include customized spacing along the straps 112 to accommodate various and different sized computers in each row 100.

Each spacer block 114 separates adjacent computers 102 by a dimension equal to the width 122 (FIG. 3) of the blocks 114. In the embodiment shown in FIGS. 1-6, each block 114 preferably has a width of one inch, which is sufficient to enhance the flow of cooling air between and around each computer 102 while not significantly impacting the overall number of computers that fit on the platform 104. However, those skilled in the art will recognize that alternative spacing (either greater or less than one inch) between adjacent computers 102 may be desirable for the purpose of either improving air circulation or increasing the density of the computers on the platform 104, and thus the width of the spacer blocks 114 may be altered within the scope of the present invention. Additionally, each block 114 has a depth dimension 124 (FIG. 3) that is equal to or shorter than a depth dimension of the associated computer 102, thereby allowing the blocks 114 to fit completely between adjacent computers 102 (as shown in FIG. 3) without extending beyond either a front or a rear portion of the computers. Furthermore, the spacer blocks 114 have a height dimension 126 (FIG. 6) that is sufficient to extend down between adjacent computers 102 while providing adequate surface area to securely engage and physically space the computers. In one embodiment, the height dimension 126 of the spacer blocks 114 is preferably limited to ease the process of inserting the blocks between the computers 102, as described in greater detail below. In the exemplary embodiment shown in FIGS. 1-6, the height of each block 114 is approximately two inches, although taller or shorter blocks may be used in accordance with the present invention.

Figure 4:
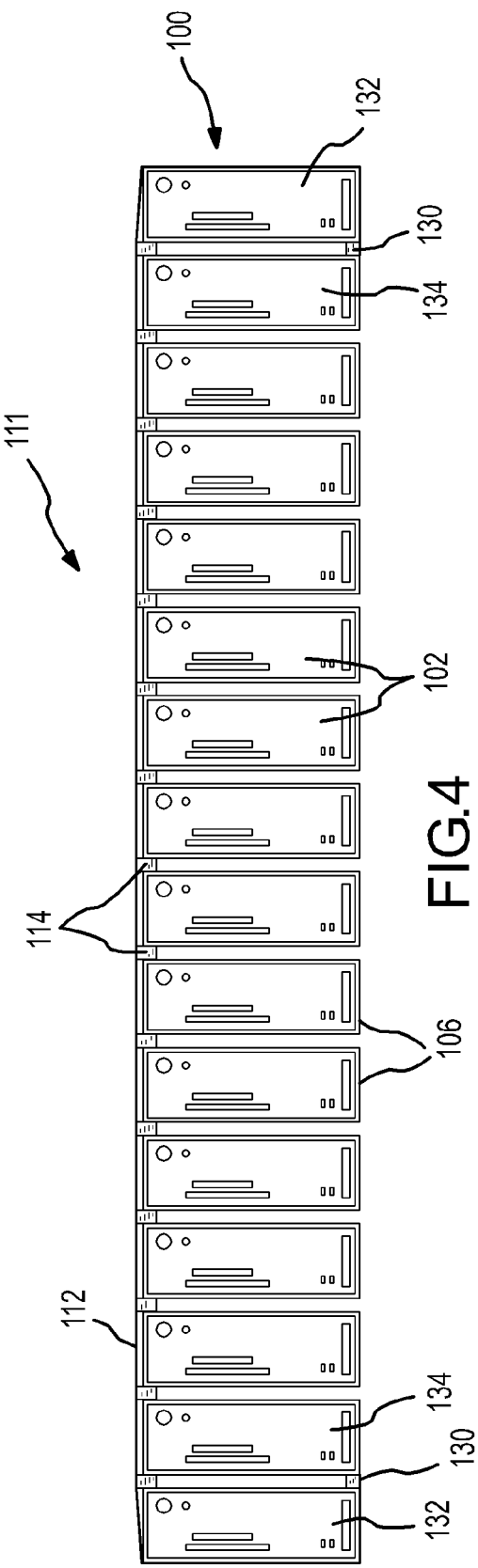
FIG. 4 illustrates an elevated front view of the row of computers and spacer blocks shown in FIG. 3, and further illustrates the position of the anchor blocks between the last two computers at each end of the computer row.
Figure 5:
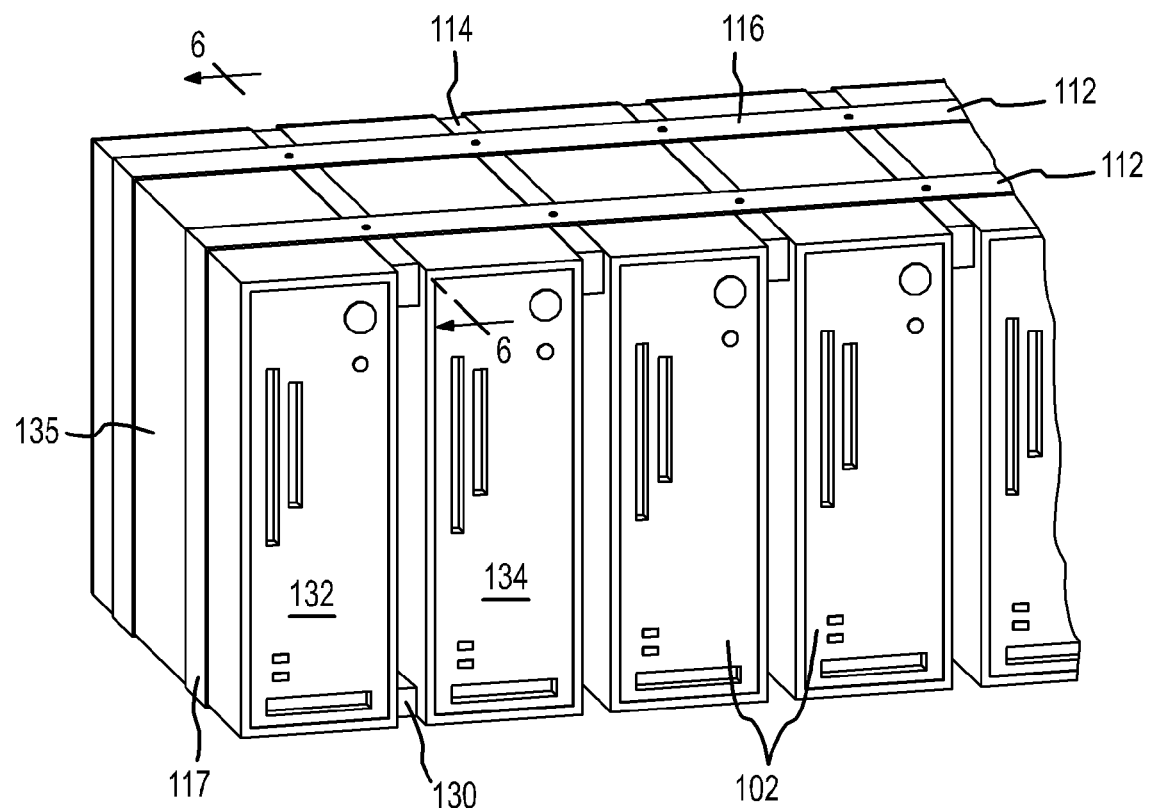
FIG. 5 illustrates an enlarged perspective view of one end of the computer row shown in FIGS. 3 and 4, further illustrating the uniform spacing between adjacent computers and the wrapping of the strap ends and the anchor block around the last computer at one end of the computer row.
Figure 6:
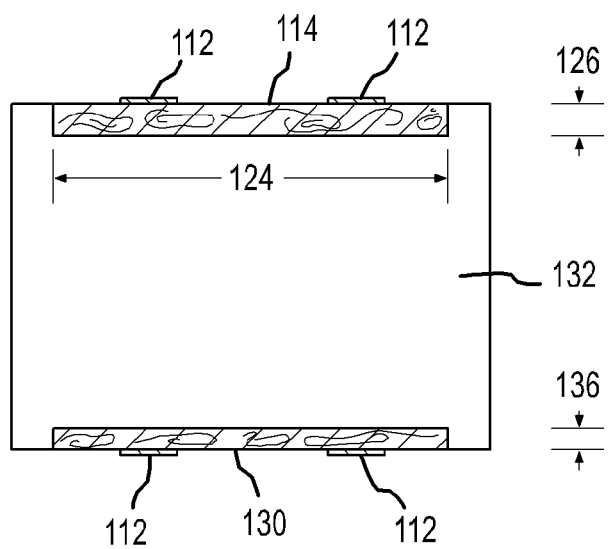
FIG. 6 is a section view taken substantially along the line 6-6 in FIG. 5, illustrating both the final spacer block and the anchor block engaging the final computer at one end of the computer row.

While the width, depth and height dimensions of the spacer blocks 114 may vary, it is preferred that each of the blocks 114 be inserted substantially between adjacent computers 102 so that the straps 112 are positioned on or near the top surface 118 of the computers. For example, FIGS. 1 and 4 illustrate the blocks 114 and attached straps 112 positioned slightly above the top surface 118 of the computers 102, while FIGS. 5 and 6 illustrate the blocks 114 inserted completely between the computers 102 so that a top surface of the blocks 114 is substantially flush with a top surface 118 of the computers 102. When the spacer blocks 114 are inserted in this manner, the computer spacing and stabilization system 110 does not increase the overall height or depth dimensions of the computer row 100. Indeed, the entire system 110 merely increases the required platform length by the cumulative width of the individual spacer blocks (i.e., fifteen inches in the exemplary embodiment where fifteen blocks 114 are used to space the sixteen computers 102 in each row 100 in FIG. 1).

While the spacer blocks 114 are used to provide uniform separation for adjacent computers 102, and thereby enhance the flow of cooling air between and around the computers, the computer spacing and stabilization system 110 further includes an anchor block 130 mounted at each end of the strap(s) 112. As best shown in FIG. 2, the anchor block 130 is separated from an end spacer block 114 by an end portion 117 of the strap having a length that is substantially equal to three sides of the computer 102 (i.e., twice the width and one time the height). This separation allows the anchor block 130 to be positioned between an end computer 132 and an adjacent computer 134 at each end of the computer row 100 (FIGS. 4 and 5).

As best shown in FIG. 5, the end portion 117 of the strap 112 wraps around an outward facing side panel 135 of the end computer 132 and extends underneath the end computer 132 so that the base 106 of the end computer rests on top of the strap (as shown in FIG. 6). The anchor block 130 (having the same width as the spacer blocks 114 in the exemplary embodiment) is thus situated between the end computer 132 and adjacent computer 134 and engages a bottom portion of the end computer 132, as shown in FIGS. 4 and 5. The anchor block 130 is securely attached to the strap 112 (utilizing fasteners 119 or other means as described above) to prevent the strap from being pulled out from underneath the end computer 132. By including an anchor block at each end of the strap(s) 112, the strap effectively ties or groups the individual computers 102 together into an assembly 111 so that the entire row 100 of computers is more stable and resistant to tipping than the individual computers 102 standing alone. In other words, the computer spacing and stabilization system 110 effectively converts each end computer 132 into a "bookend" that stabilizes the assembly 111 and limits lateral movement of the entire computer row 100 (i.e., any lateral force that would otherwise tend to topple the computers 102 is resisted by the strap(s) 112 and the anchor blocks 130).

In the exemplary embodiment shown in FIG. 2, each anchor block 130 includes width and depth dimensions that are equal to the width 122 and depth 124 of the spacer blocks 114 (although the present invention is not limited by this exemplary anchor block 130 and the dimensions of the block 130 may vary from the dimensions of the spacer block 114). Similarly, a height dimension 136 (FIG. 6) of the anchor block 130 may be the same as the height dimension 126 of the spacer blocks 114. However, in the exemplary embodiment shown in FIGS. 1-6, the height dimension 136 is preferably one-half the height dimension 126 of the spacer block 114 (i.e., one inch high). The reduced height of the anchor block 130 is due to the fact that a large surface area contact between the anchor block 130 and the end computer 132 is not necessary to maintain the anchor block in place (i.e., the anchor block 130 need only be large enough to avoid being pulled underneath the end computer 132).

As described generally above, the computer spacing and stabilization system 110 shown in FIGS. 1-6 serves the dual purpose of stabilizing the row 100 of computers (using the strap(s) 112 and the anchor blocks 130) while providing substantially uniform spacing between adjacent computers 102. Although the exemplary blocks 114 and 130 shown in FIGS. 1-6 are rectangular in shape (and formed from wood as described above), numerous alternative materials, shapes and sizes of the spacer and anchor blocks may be used and the present invention is not limited by disclosed exemplary embodiments. For example, the rectangular blocks 114 shown in FIGS. 1-6 may be formed from a foam material such as polystyrene having a relatively high density and low degree of compressibility.

Figure 7:
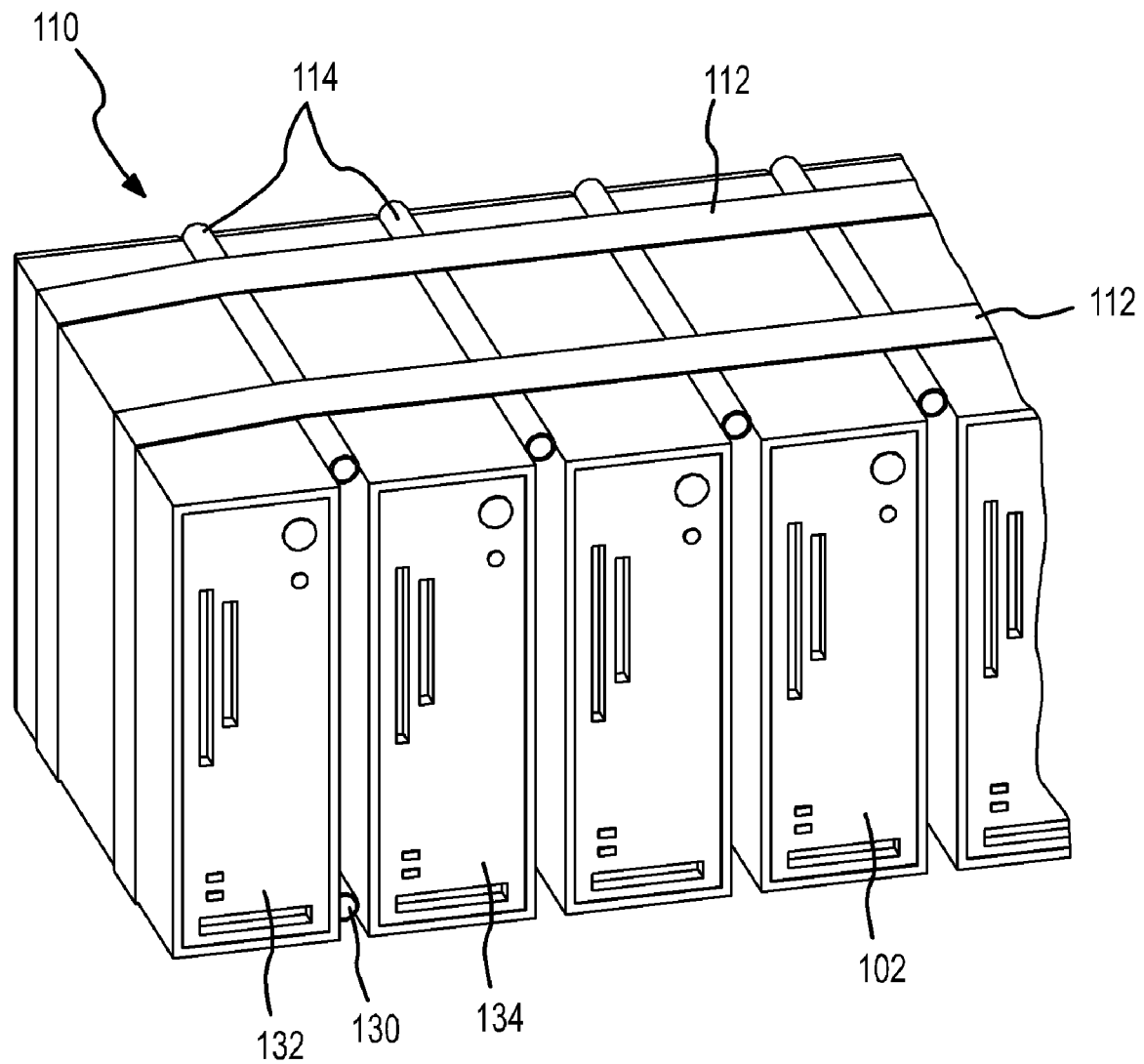
FIG. 7 illustrates a perspective view of an alternative embodiment of the spacing and stabilization system shown in FIGS. 1-6, wherein both the spacer blocks and the anchor blocks are formed from cylindrical tubes.

FIG. 7 illustrates one alternative embodiment wherein the spacer blocks 114 and the anchor blocks 130 are formed from cylindrical tubes. In one embodiment, the cylindrical blocks 114 and 130 are formed from hollow plastic tubes due to the rigidity and relatively low cost of such tubes, while in a further embodiment the cylindrical blocks are metallic (e.g., formed from aluminum) to further transfer heat away from the warm computer cases via conduction. The hollow nature of the cylindrical spacers allows relatively warm air trapped behind the computers 102 to travel through the hollow spacers, thereby improving the circulation of cooling air. In exemplary embodiments, the cylindrical tubes 114 and 130 may be attached to the strap(s) 112 by conventional fasteners (e.g., staples), adhesives, or other means known to those skilled in the art.

Figure 8:
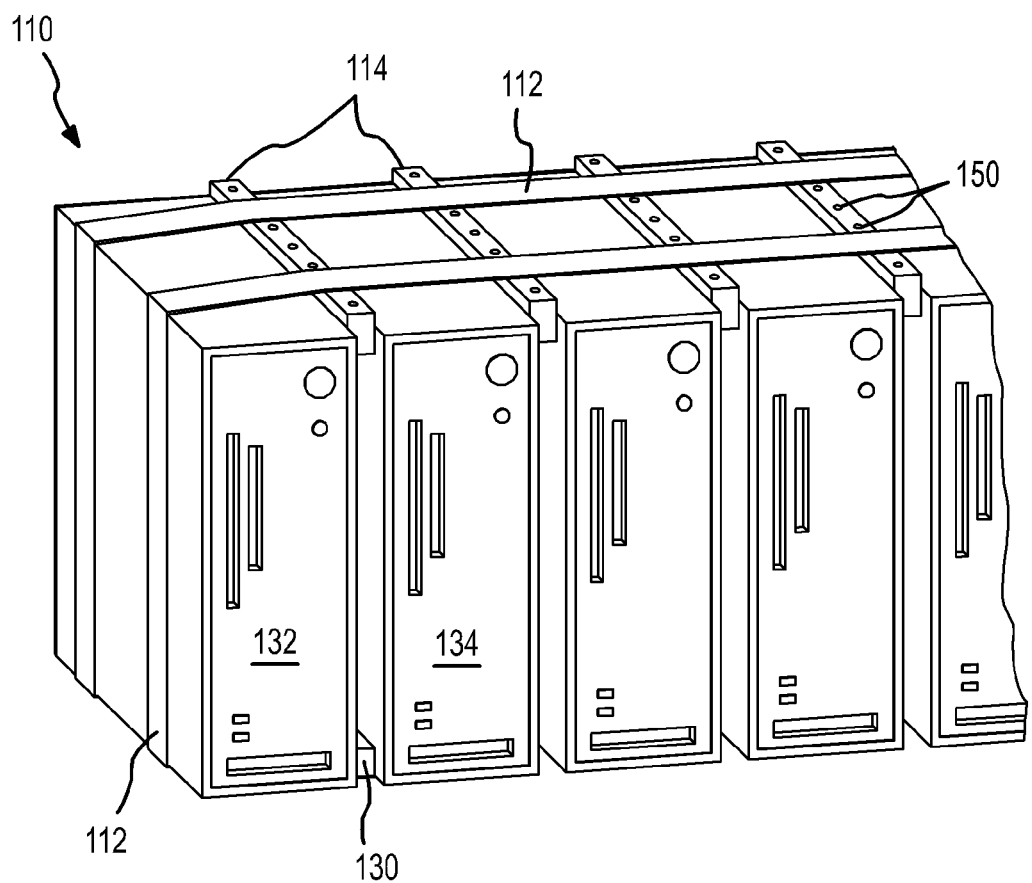
FIG. 8 illustrates a perspective view of an alternative embodiment of the spacing and stabilization system shown in FIGS. 1-6, wherein vertical holes are formed through the spacer blocks to enhance the flow of air between adjacent computers.

A second alternative embodiment of the computer spacing and stabilization system 110 is shown in FIG. 8, wherein the rectangular spacer blocks 114 include a series of vertical holes 150 arranged along the depth dimension 124 of the blocks 114. The vertical holes 150 pass all the way through the blocks 114 to allow heated air to flow upward through the holes 150 and between the adjacent computers 102, thereby enhancing the circulation of cooling air to the row 100 of computers. Thus, while the spacer blocks 114 provide substantially uniform spacing between the computers 102 (thereby allowing hot air exhausted from the rear of the computers to escape outward between the computers), the presence of the holes 150 within the spacer blocks 114 speeds the process by which heated air is directed away from the computers (i.e., by allowing the rising air to escape upward through the holes 150).

Figure 9:
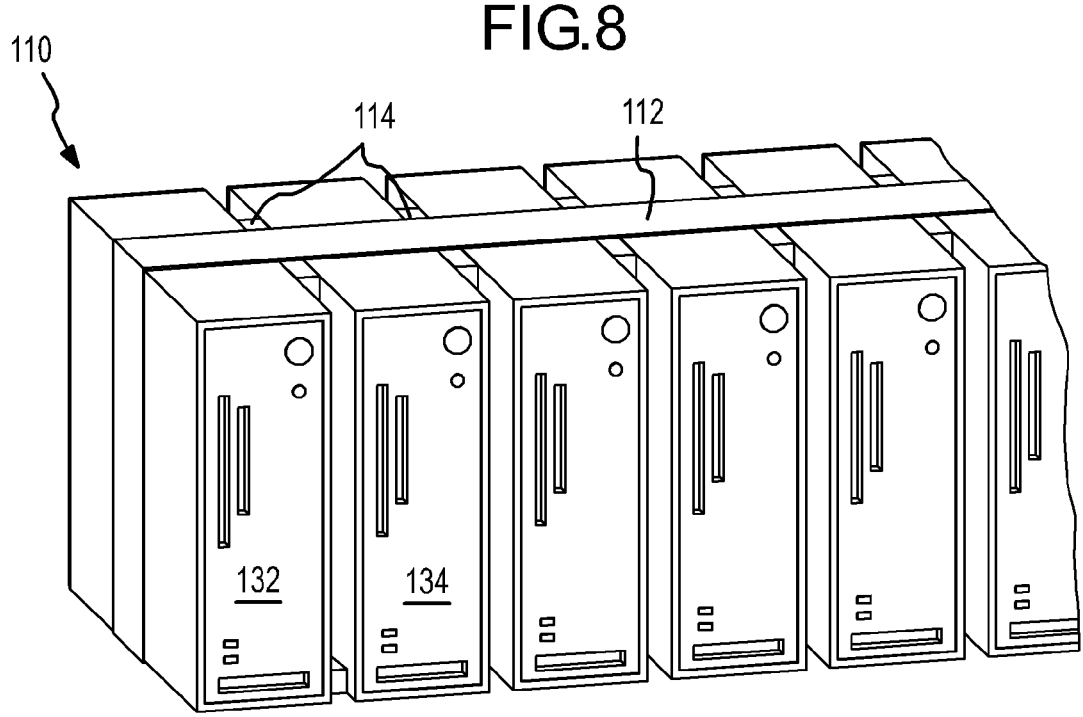
FIG. 9 illustrates a perspective view of an alternative embodiment of the spacing and stabilization system shown in FIGS. 1-6, wherein a single strap connects both spacer and anchor blocks having a relatively shorter depth to enhance air flow between adjacent computers.

As an alternative to (or in addition to) the vertical holes 150 within the spacer blocks 114 shown in FIG. 8, a shorter version of the spacer blocks 114 may be used to further enhance the upward flow of warm air between adjacent computers 102. In particular, FIG. 9 illustrates spacer blocks 114 having similar width and height dimensions to those shown in FIGS. 1-6, but with a smaller depth dimension 124. In the exemplary embodiment shown in FIG. 9, the depth dimension of the spacer blocks 114 is approximately one-half the depth of the adjacent computers 102. This reduced depth allows heated air to rise between the computers 102 (i.e., both in front of and behind the blocks 114) while still maintaining adequate surface area to engage each adjacent computer 102 and provide for substantially uniform spacing between the computers, as shown in FIG. 9.

Additionally, the embodiment of the computer spacing and stabilization system 110 shown in FIG. 9 utilizes a single strap 112 to attach each of the spacer blocks 114 and anchor blocks 130. Due to the shorter depth of the spacer blocks 114 in FIG. 9, a single-strap configuration adequately supports each of the attached spacer blocks 114 and anchor blocks 130. Indeed, as described above, the present invention is not limited to any particular number or size of straps 112, nor to any particular means for attaching the blocks to the strap(s) 112. Furthermore, those skilled in the art will comprehend many alternative materials for both the straps 112 and the blocks (114, 130), and all of such alternatives are considered to fall within the scope of the present invention.

Figure 10:
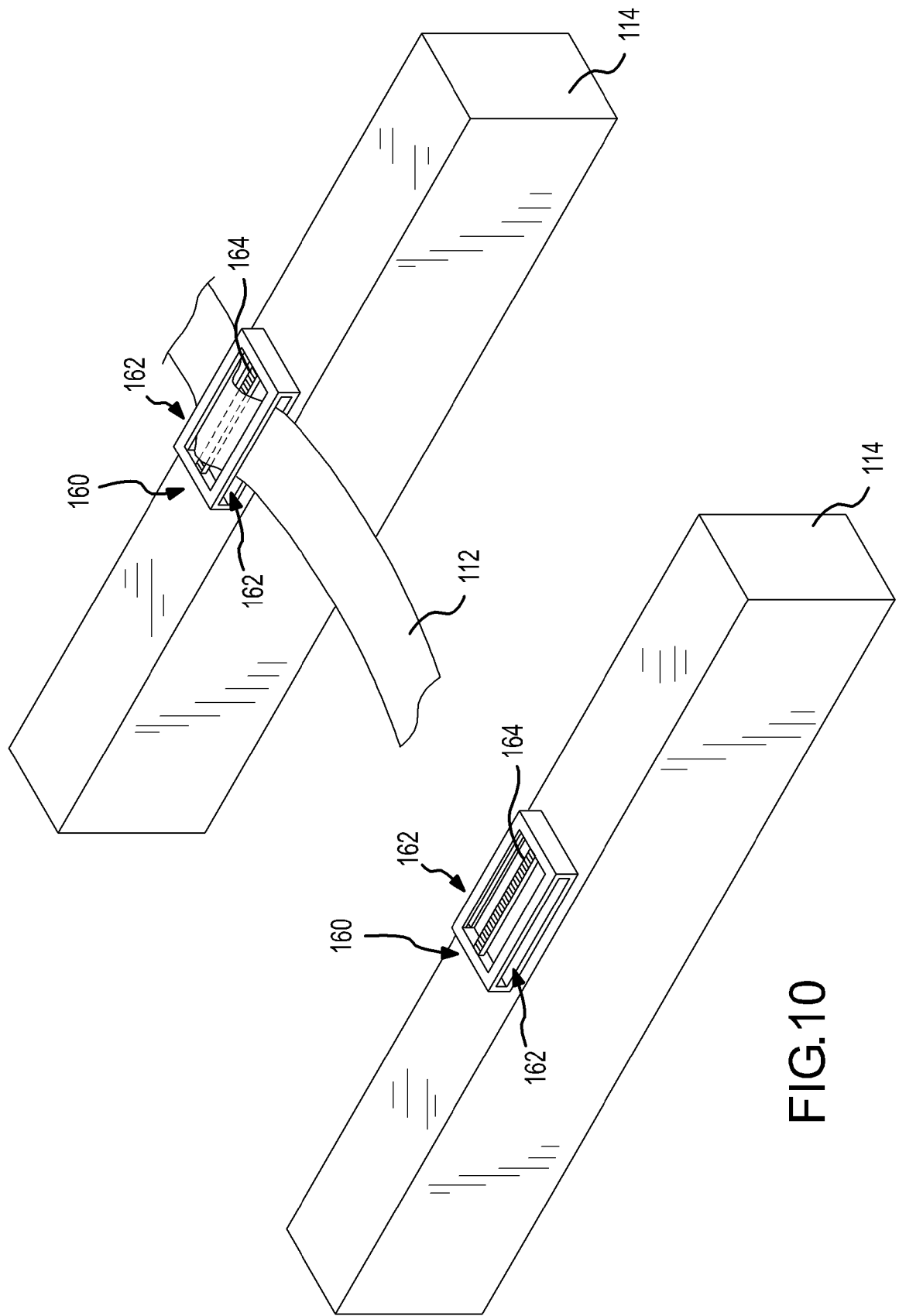
FIG. 10 illustrates an enlarged perspective view of an alternative embodiment of the spacing and stabilization system shown in FIGS. 1-6, wherein the spacer blocks include buckles attaching the blocks to the strap, and wherein the buckles allow the position of the blocks on the strap to be adjusted to match the dimensions of the computers within the computer row.

Computer centers or high-density computer labs typically utilize the same model computers 102 throughout the lab, thereby allowing a fixed spacing to be used for both the spacer blocks 114 and the anchor blocks 130. However, it is possible that computers of different sizes may be arrayed in separate rows 100 within the lab. To accommodate different sized computers (and particularly computers having a different width dimension 120), FIG. 10 illustrates an adjustable version of the computer spacing and stabilization system 110 wherein each of the blocks (114 and 130) includes a buckle 160 for releasably securing the block to the strap 112. In particular, each buckle 160 is secured to a block (114 or 130), and the strap 112 passes through the buckle 160 in a manner that provides for a releasable yet secure connection of the strap to the buckle (and thus to the corresponding spacer block 114 or anchor block 130). Such a releasable connection allows for adjustable spacing between the blocks 114 (as opposed to a fixed spacing that is tailored to fit one particular type or size of computer). For example, if the computers 104 within a computer lab are replaced, an adjustable embodiment of the computer spacing and stabilization system 110 would allow for the spacing between adjacent blocks 114 to be modified in order to accommodate the width dimension of the new computers.

In the exemplary embodiment shown in FIG. 10, the buckle 160 is of conventional construction and includes opposing openings 162 and a central bar 164 over which the strap 112 passes. The central bar 164 is preferably serrated to more tightly engage the strap material (e.g., nylon) when the strap 112 is pulled down tightly over the bar 164. Thus, when the position of the buckle 160 (and the attached block 114 or 130) requires adjustment, a user can pry the strap 112 off of the central bar 164 and pull a portion of the strap 112 through one of the openings 162 until the buckle 160 is properly positioned on one portion of the strap. The slack portion of the strap 112 (above the central bar 164) is then pulled through the opposite opening 162 until the strap material again snugly engages the central bar 164. This process is repeated for each of the remaining blocks 114 or 130 (and their attached buckles 160) until a desired spacing is achieved between adjacent blocks.

While FIG. 10 illustrates one exemplary embodiment of a buckle 160 for releasably securing and adjustably positioning the spacer blocks 114 and anchor blocks 130 along the strap 112, the present invention is not limited by this example and may include alternative means for adjusting the spacing between adjacent blocks. Such alternative means would be readily apparent to those skilled in the art and may include, without limitation, the use of VELCRO straps 112 and VELCRO attachments on each of the blocks 114 and 130.

Figure 11:
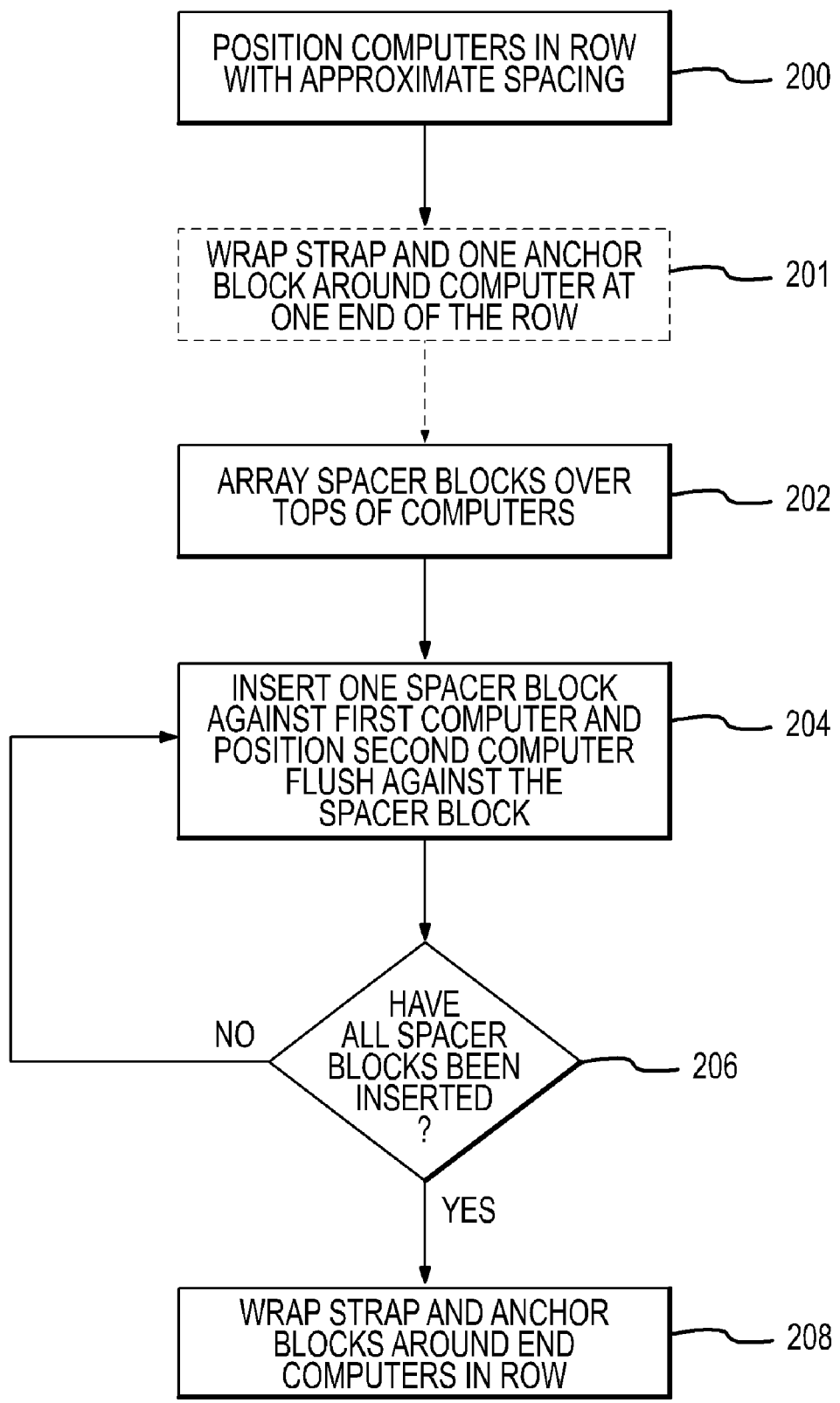
FIG. 11 illustrates a flow diagram of a process for spacing and stabilizing a row of computers utilizing the system shown in FIGS. 1-10.

Regardless of the shape or size of the spacer blocks 114 and the anchor blocks 130, or the number of straps 112 used to secure the blocks, the computer spacing and stabilization system 110 is simple to install and may be retrofitted on existing arrangements of computers. FIG. 11 illustrates a flow chart of one exemplary method for installing the computer spacing and stabilization system 110 on a row 100 of computers. Initially, the computers 102 are positioned (e.g., on a platform 104) in step 200 so that there is a gap between each computer, where the approximate size of the gap is based on the width dimension of the spacer blocks 114 (e.g., one inch). Next, the strap(s) 112 and spacer blocks 114 are arrayed across the top of the computer row 100 in step 202 so that the blocks 114 are substantially aligned over each of the corresponding gaps between the computers 102 (an optional step 201 of first positioning one of the anchor blocks 130 is described below). Starting at one end of the row 100, a first spacer block 114 is positioned against a first computer in step 204, and a second computer is repositioned until it engages an opposite side of the spacer block 114 (thereby providing a uniform space between the first and second computers). Thus, in the example shown in FIG. 5, the first spacer block 114 is pushed down between the end computer 132 and the adjacent computer 134. The position of computer 134 is then adjusted until the first spacer block 114 fully engages both computers 132 and 134. The next spacer block 114 is then pushed down on the right side of computer 134, and the position of the next computer in line is also adjusted until if fully engages the second spacer block 114. This process continues until a determination is made in step 206 that the final spacer block 114 has been inserted and the last computer 102 has been positioned.

Finally, the process in FIG. 11 is completed in step 208 when the strap 112 is wrapped around each end computer 132 and each anchor block 130 is positioned between the corresponding end computer 132 and adjacent computer 134 (e.g., each end computer 132 is lifted a short distance off the platform 104 to allow the anchor block 130 and attached strap 112 to pass underneath the end computer 132). Alternatively, the strap 112 and one anchor block 130 may be wrapped around one of the two end computers 132 prior to arraying the strap(s) 112 and spacer blocks 114 across the top of the computer row 100 in step 202. This optional step 201 is shown via a dashed box in FIG. 11.

The various steps shown in FIG. 11 may be practiced in a different order by those skilled in the art without altering the scope of the present invention, and certain steps may be combined with other steps. For example, each computer 102 may be arranged or placed on the platform one at a time rather than first arranging the entire row of computers in step 200 (i.e., following the placement of the anchor block 130 under the end computer 132 in optional step 201, the adjacent computer 134 may be added after placement of the first spacer block 114 against the top of end computer 132, etc.). However, one benefit of the system 110 is that the relatively short spacer blocks 114 may be inserted between the computers without requiring a great deal of clearance above the computer row 100. In fact, each spacer block 114 may be inserted from in front of the computer row 100 if the shelving in the computer lab does not provide sufficient clearance above the computers (i.e., less than two inches in the exemplary embodiment shown in FIGS. 1-6).

Another benefit of the present invention is that the uniform spacing between computers 102 enhances the ease with which a single computer may be removed from and/or replaced within the row 100. Thus, in the case where a single computer 102 malfunctions and requires replacement, the computer may be easily grasped and slid from between the two adjacent computers due to the spacing provided on each side of the computer. Similarly, when a replacement computer is added to the row 100, the opposing spacer blocks 114 act as guides to help a user slide the computer back into place. Thus, as described above and shown in FIGS. 1-10, the computer spacing and stabilization system 110 provides numerous benefits relating to cooling, stabilizing and maintaining (i.e., removing and replacing) computers within a high-density computer lab.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A system for spacing and stabilizing computers comprising:
   a strap having a central portion and opposing end portions;
   a plurality of spacer blocks attached to the central portion of the strap, each spacer block adapted to be inserted between adjacent computers in a row of computers to provide substantially uniform spacing between the adjacent computers equal to a width dimension of the spacer block; and an anchor block attached to each end of the strap, wherein each end portion of the strap and each anchor block are adapted to be wrapped around a computer at each end of a row of computers to limit movement of the strap and the attached spacer blocks.

2. A system as defined in claim 1, wherein the spacer blocks are fixedly attached to the strap to provide a substantially uniform space between each pair of adjacent spacer blocks.

3. A system as defined in claim 1, wherein the spacer blocks are releasably attached to the strap to provide adjustable spacing between each pair of adjacent spacer blocks.

4. A system as defined in claim 1, wherein each spacer block includes an opening to allow for the passage of air through the spacer block.

5. A system as defined in claim 4, wherein:
each spacer block defines one of a rectangular or cylindrical shape; and
each spacer block is formed from either wood, plastic, foam or metal.

6. A system as defined in claim 1, wherein a width dimension of each anchor block is substantially equal to the width dimension of each spacer block.

7. A system as defined in claim 1, further comprising a plurality of straps attached to each spacer block and each anchor block.

8. A computer assembly comprising:
a plurality of computers arranged in a row, each computer including a top surface and an opposing base to support the computer on a platform, wherein a width dimension of each computer base is less than a height dimension of the computer, and wherein the plurality of computers includes an end computer positioned at each end of the row;
a plurality of spacer blocks, each spacer block positioned between two adjacent computers within the row to provide substantially uniform spacing between the adjacent computers equal to a width dimension of the spacer block;
an anchor block positioned between each end computer and an adjacent computer within the row, wherein each anchor block engages a bottom portion of each end computer; and
a strap attached to each spacer block and each anchor block, wherein the strap surrounds three sides of each end computer and extends over the top surface of each computer within the row to limit lateral movement of the plurality of computers.

9. A computer assembly as defined in claim 8, wherein a top surface of each spacer block is positioned substantially flush with the top surface of each adjacent computer.

10. A computer assembly as defined in claim 8, wherein the spacer blocks are fixedly attached to the strap.

11. A computer assembly as defined in claim 8, wherein the spacer blocks are releasably attached to the strap to provide adjustable spacing between each pair of adjacent spacer blocks.

12. A computer assembly as defined in claim 8, wherein each spacer block includes a plurality of vertical holes extending in the height dimension of the computer to allow for the vertical passage of air between adjacent computers.

13. A computer assembly as defined in claim 8, wherein a height dimension of each anchor blocks is less than a height dimension of each spacer block.

14. A computer assembly as defined in claim 13, wherein a depth dimension of each spacer block is less than a depth dimension of each adjacent computer.

15. A computer assembly as defined in claim 8, further comprising a plurality of straps attached to each spacer block and each anchor block.

16. A method of spacing and stabilizing a plurality of computers, comprising:
arranging the plurality of computers in a row on a platform;
arraying a strap and a plurality of attached spacer blocks over a top surface of the row of computers;
inserting each spacer block between a pair of adjacent computers within the row and adjusting the position of the adjacent computers to engage the spacer block, thereby providing substantially uniform spacing between each pair of adjacent computers; and
wrapping an end portion of the strap and an attached anchor block around an end computer at each end of the row of computers to limit lateral movement of the plurality of computers.

17. A method as defined in claim 16, wherein:
a first anchor block is wrapped around a first end computer prior to arraying the spacer blocks over the top surface of the row of computers; and
a second anchor block is wrapped around a second end computer after each spacer block has been inserted between a corresponding pair of computers.

18. A method as defined in claim 16, wherein inserting each spacer block between the pair of adjacent computers further includes positioning a top surface of each spacer block substantially flush with the top surface of each adjacent computer.

19. A method as defined in claim 16, wherein each spacer block is releasably attached to the strap, the method further comprising:
prior to arraying the spacer blocks over the top surface of the row of computers, adjusting a position of each spacer block on the strap to provide spacing between adjacent spacer blocks that is substantially equal to a width dimension of each computer.

20. A method as defined in claim 16, further comprising form an opening in each spacer block to allow for the passage of air through the spacer block.

* * * * *